United States Patent [19]

Tracy

[11] Patent Number: 4,626,312
[45] Date of Patent: Dec. 2, 1986

[54] PLASMA ETCHING SYSTEM FOR MINIMIZING STRAY ELECTRICAL DISCHARGES

[75] Inventor: David H. Tracy, Norwalk, Conn.

[73] Assignee: The Perkin-Elmer Corporation, Norwalk, Conn.

[21] Appl. No.: 748,291

[22] Filed: Jun. 24, 1985

[51] Int. Cl.[4] .......................... B44C 1/22; C03C 15/00; C03C 25/06; C23F 1/02
[52] U.S. Cl. .................................. 156/345; 156/643; 156/646; 204/298
[58] Field of Search .................. 156/345, 643, 646; 204/192 EC, 192 E, 298; 427/38, 39; 118/728, 50.1, 620

[56] References Cited

U.S. PATENT DOCUMENTS 4,134,817  1/1979  Bourdon ................... 204/192 E
4,253,907  3/1981  Parry et al. .................. 156/643
4,399,016  8/1983  Tsukada et al. ........... 156/345 X Primary Examiner—William A. Powell
Attorney, Agent, or Firm—Thomas P. Murphy; Edwin T. Grimes; Francis L. Masselle

[57] ABSTRACT

A plasma etching system includes a grounded reactor chamber having ungrounded chuck and counter electrodes therein. Circuitry is provided so that the potentials applied to the electrodes are about half those normally applied in single ended systems so that stray electrical discharges from the electrodes to the reactor chamber and other parts in the system are minimized.

6 Claims, 4 Drawing Figures

PLASMA ETCHING SYSTEM FOR MINIMIZING STRAY ELECTRICAL DISCHARGES

BACKGROUND OF THE INVENTION

Plasma etching systems have included reactor chambers including a pair of electrodes to which R.F. power is applied. A wafer including a film thereon to be etched is generally placed on one of the electrodes. Suitable gases are injected into the chambers and plasma is formed to provide the etching of the film. High or low radio frequencies are used in the etching process dependent upon the type of film being etched.

One of the problems found in R.F. plasma etching involves excessive stray electrical discharges from the electrodes to the reactor chamber and other parts in the system. When the wafer is on a grounded chuck electrode and the voltage is applied to an upper counter electrode, the voltage between the upper electrode and the wafer is always less than the voltage between the upper electrode and the walls of the system which are generally grounded. This is because the wafer itself is never exactly at chuck potential, but is electrically isolated from the chuck electrode by an insulating coating on the back of the wafer. The result is that some of the current goes from the upper electrode to various grounded surfaces in the system instead of to the wafer where it will do some good in the etching process.

The higher the power the worse the problem of stray discharges becomes, and the more R.F. current is diverted to grounded surfaces. The stray discharges become a problem because a certain amount of power still has to reach the wafer. Stray discharges tend to be erratic, and are unstable. This means that it is difficult to always predict how much power will go to the wafer and how much will go into stray discharges.

OBJECTS OF THE INVENTION

It is an object of this invention to provide an improved plasma etching system in which stray electrical discharges between an R.F. powered electrode and other parts of the system is minimized.

It is a further object of this invention to provide an improved plasma etching system in which the R.F. power requirements are minimized.

It is still a further object of this invention to provide an improved R.F. plasma etching system with improved process consistency and reliability, and which provides improved spatial etch uniformity.

It is still a further object of this invention to provide an improved R.F. plasma etching system in which stray electrical discharges are minimized to minimize likelihood of damage to the reactor and which permits use of higher R.F. power densities than would normally otherwise be possible.

BRIEF SUMMARY OF THE INVENTION

In accordance with the present invention, a grounded plasma etching chamber includes insulated counter and chuck electrodes, with a wafer having a film to be etched being disposed on the chuck electrode. A radio frequency voltage is applied across the electrodes. Means are provided to split the voltage so that substantially equal voltages are applied to the two electrodes.

Other objects and advantages of the present invention will be apparent and suggest themselves to those skilled in the art, from a reading of the following specification and claims, taken in conjunction with the accompanying drawings.

DESCRIPTION OF THE INVENTION

Figure 1:
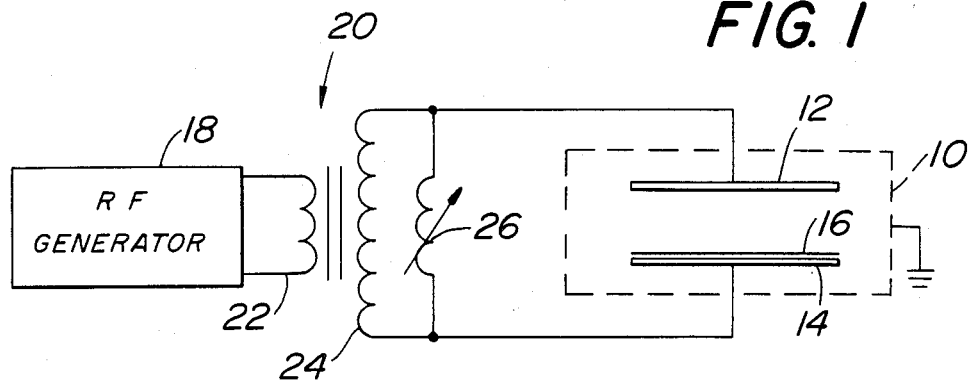
FIGS. 1 and 2 are schematic diagrams, partly in block diagram form, illustrating two different embodiments of the present invention.

Referring to FIG. 1, a low frequency plasma etching system comprises a plasma etching chamber 10. The walls of the chamber are grounded, or returned to a point of some reference potential. Gases are injected into the chamber and suitable cooling is provided in conventional manners. Because many of the details relating to such things as vacuum pumping lines and other elements in the plasma etching system involved are conventional and only indirectly related to the invention, they are not illustrated or described in detail for purposes of clarity.

A counter electrode 12 and a chuck electrode 14 within the chamber 10 are isolated from the walls of the chamber. A wafer 16 is disposed on the chuck electrode 14 and capacitively coupled thereto through an insulating film which may normally be on the wafer or on the chuck electrode. The capacitive coupling maintains the R.F. potential of the wafer 16 close to that of the chuck electrode 14.

A source of low frequency R.F. signals 18 is connected to a matching transformer 20 including a primary winding 22 and a secondary winding 24, which is connected across the electrodes 12 and 14. A tuning inductor 26 is connected across the secondary winding 24 to improve the matching of the transformer 20 and to tune out the capacitance of the chamber 10 and also the discharge capacitance.

It is noted that both electrodes 12 and 14 are ungrounded and driven with oppositely phased R.F. signals from the source 18. Because of this, the R.F. potential at each electrode is about half that of a driven electrode in a conventional reactor used heretofore.

The entire secondary circuit of the transformer 20 is permitted to float both as to the R.F. potential and any D.C. potential in such a way as to equalize capacitive and stray discharge currents to ground from the two electrodes 12 and 14. As mentioned, the total R.F. voltage is split evenly between two electrodes. It was found that etch performance, for $SiO_2$ etching at 400 kHz was basically unaffected compared to a single ended system provided, of course, that the same R.F. voltage was applied across the electrodes. However, it was found that the R.F. power requirements were less and that other advantages were attained through use of the present invention illustrated in FIG. 1.

The reduction of stray discharges at 400 kHz, almost amounting to elimination of such discharges, results from the non-linearity of stray discharge power with respect to the electrodes to ground R.F. potential. It was found that the stray power increases at least as the square of the voltage with a relatively sharp cut-off at an electrode voltage $V_c$. Therefore, cutting the peak electrode to ground voltage in half helps considerably.

Figure 4:
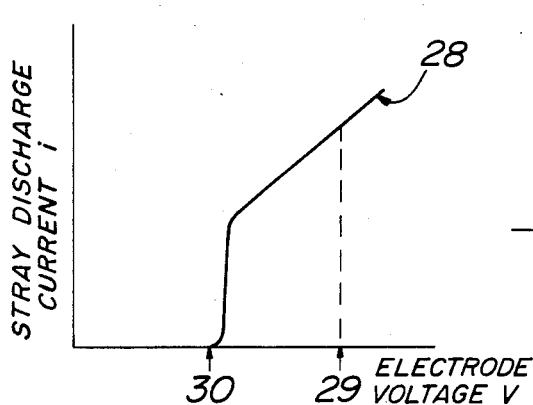
FIGS. 3 and 4 are waveforms shown for purposes of explanation of the embodiments illustrated in FIGS. 1 and 2, respectively.

Referring to FIG. 4, curve 28 illustrates the dependence of stray discharge R.F. current upon electrode to ground R.F. potential. The R.F. voltage indicated at 29 corresponds to a typical single ended etching condition, with considerable stray discharge current to grounded surfaces. The voltage indicated at 30 is the voltage present on each electrode when the electrodes are split as in the present invention. The etch rate is the same, but the stray discharge currents are nearly zero. Below a certain power density on the wafer, splitting the R.F. drive, virtually eliminates stray discharges.

Figure 2:
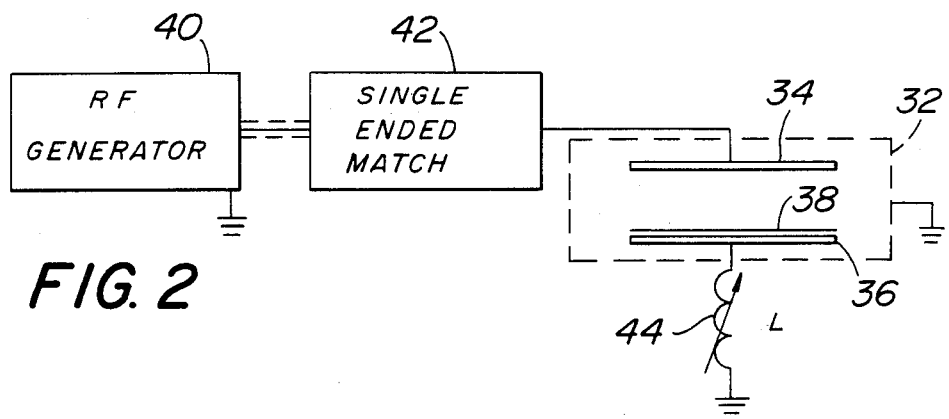

Referring to FIG. 2, a second embodiment of the present invention includes a high R.F. frequency plasma etching system where the technique of achieving quasisymmetric excitation of the electrodes applies only when the discharge load impedance is highly capacitive.

A grounded reactor chamber 32 includes a counter electrode 34 and a chuck electrode 36. A wafer 38 having a film thereon to be etched is disposed on the chuck electrode 36.

A source of high R.F. power 40, which may generate signals in the frequency range of about 13 MHz, is connected through a single ended matching network 42 across the electrodes 34, 36 and an inductor 44. The inductor 44 is connected between the electrode 36 and ground. In this embodiment, the source of power 40 is also returned to ground, or other point of reference potential. In the embodiment illustrated, with a frequency of 13 MHz with discharges at 0.3 to 5 torr, the load impedance is highly capacitive.

The electrode 34 is driven in a conventional way using an adjustable matching network of single ended design. The electrode 36 is connected to ground through the adjustable inductor 44.

Figure 3:
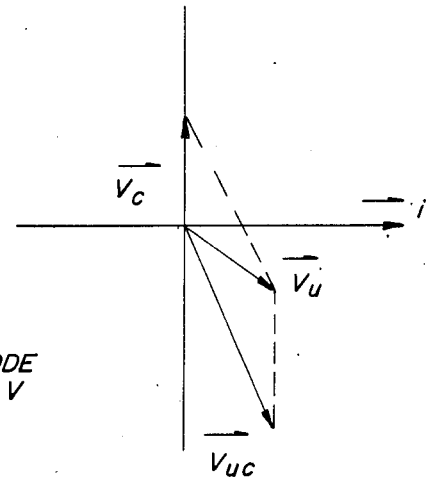

The value of the inductor 44 is chosen so as to tune with the plasma series capacitance at the R.F. drive frequency. This capacitance comprises primarily the capacitance between the electrodes 34 and 36 and that of the plasma sheath. The inductor 44 is adjusted to substantially equalize the R.F. potentials on the electrodes 34 and 36 at voltages somewhat higher than half the usual single-sided excitation voltage. The operation of FIG. 2 is illustrated in the vector diagram in FIG. 3.

The R.F. series current i through the reactor 44 is used as the phase reference. The voltage across the plasma is $\overline{V}_{uc} = \overline{V}_u - \overline{V}_c$, where $\overline{V}_u$=voltage on counter electrode 34 and $\overline{V}_c$=voltage on the chuck electrode 36. $\overline{V}_c$ lags almost 90° behind i, due to the highly capacitive nature of the plasma discharge. The chuck voltage $\overline{V}_c$, however, leads by 90° in fact, $$\overline{V}_c = j\omega L i$$

Referring to FIG. 4, it is clear that $|V_u| < |V_{uc}|$, and that L (the inductor 44) can be adjusted to give $|V_c| \cong |V_u| \cong 0.5|V_{uc}|$.

When L, i.e., the inductor 44, is so adjusted, the effective load impedance seen by the match network 42 is $\overline{V}_u/i$, which is both smaller in magnitude and less capacitive than is the case with the chuck grounded (L=0). Thus, the impedance transformation demands on the match network are reduced and in some cases the network may be eliminated. Also, circulating currents and peak voltages are reduced. Stray discharges, though not eliminated, are significantly suppressed, particularly when operating at high plasma power densities (>2 W/cm$^2$).

Basically, the present invention has provided circuitry for minimizing stray electrical discharges in plasma etching systems for both low and high frequency R.F. systems. This was accomplished by lowering the voltage requirements at the electrodes to approximately one-half their normal levels with the total voltage between the two electrodes being substantially the same as single ended etching systems so that the overall etching operation with respect to time and quality is not affected.

What is claimed is:

1. A plasma etching system comprising:
   (a) a grounded reactor chamber for performing an etching operation;
   (b) a counter electrode and a chuck electrode for receiving a wafer having a film thereon to be etched;
   (c) said electrodes being isolated from the walls of said chamber: and
   (d) an ungrounded source of low frequency radio frequency power connected across said counter and chuck electrodes to perform an etching operation while minimizing electrical discharges from said electrodes to said reactor chamber.

2. A plasma etching system as set forth in claim 1 wherein said source of radio frequency power includes a matching transformer connected to said source, with a secondary winding connected across said counter and chuck electrodes.

3. A plasma etching system as set forth in claim 2 wherein said wafer is capacitively coupled to said chuck electrode.

4. A plasma etching system as set forth in claim 3 wherein an inductive element is connected across said secondary winding to tune out the capacitive effects of elements connected to said chamber.

5. A plasma etching system as set forth in claim 4 wherein the frequency of the radio frequency power is approximately 400 kHz.

6. A plasma etching system comprising:
   (a) a grounded reactor chamber for performing an etching operation;
   (b) a counter electrode and a chuck electrode for receiving a wafer having a film thereon to be etched isolated from the walls of said chamber;
   (c) a source of high frequency radio frequency power;
   (d) means for applying power from said source across said counter and chuck electrodes;
   (e) a matching network connected between one end of said source and said counter electrode;
   (f) a variable inductor connected between an opposite end of said source and said chuck electrode; and
   (g) said variable inductor being variable to substantially equalize radio frequency potentials on said counter and chuck electrodes.

* * * * *